(12) United States Patent
Takahashi

(10) Patent No.: US 6,856,552 B2
(45) Date of Patent: Feb. 15, 2005

(54) SEMICONDUCTOR MEMORY AND METHOD OF DRIVING THE SAME

(75) Inventor: Satoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 10/207,056

(22) Filed: Jul. 30, 2002

(65) Prior Publication Data

US 2003/0103384 A1 Jun. 5, 2003

(30) Foreign Application Priority Data

Nov. 30, 2001 (JP) ........................................ 2001-367052

(51) Int. Cl.$^7$ ............................................... G11C 16/00
(52) U.S. Cl. ............................ 365/185.29; 365/185.22; 365/185.18
(58) Field of Search ...................... 365/185.18, 185.22, 365/185.27, 185.28, 185.29

(56) References Cited

U.S. PATENT DOCUMENTS 5,930,173 A * 7/1999 Sekiguchi ............... 365/185.22
5,949,717 A * 9/1999 Ho et al. ............... 365/185.29

* cited by examiner

*Primary Examiner*—Tan T. Nguyen
(74) *Attorney, Agent, or Firm*—Arent Fox PLLC

(57) ABSTRACT

Immediately after data write, a negative voltage which has an absolute value lager than that in data erase and which falls within a range over which no FN current flows is applied to a control gate, and at the same time 0 V is applied to a silicon substrate, source, and drain. In this manner, electrons trapped in a first gate oxide film are detrapped into the silicon substrate. This prevents a memory cell from passing write verify although electrons stored in a nitride film are few, prevents data changes caused by a decrease in the read margin, and improves the data holding characteristic of a memory cell.

36 Claims, 7 Drawing Sheets

PRIOR ART

SEMICONDUCTOR MEMORY AND METHOD OF DRIVING THE SAME

CROSS-REFERENCE TO RELATED APPLICATIONS

This application is based upon and claims priority of Japanese Patent Application No. 2001-367052, filed on Nov. 30, 2001, the contents being incorporated herein by reference.

BACKGROUND OF THE INVENTION

1. Field of the Invention

The present invention relates to a semiconductor memory and method of driving the same and, more particularly, to a semiconductor memory and method of driving the same suitable for use in data rewrite.

2. Description of the Related Art

A flash memory is a nonvolatile memory which holds data by storing electrons into a nitride film formed between gate oxide films. This flash memory has the advantages that, e.g., the fabrication cost can be reduced because the cell structure is simple.

Conventional data write and erase operations in a NOR flash memory cell which holds data by storing electrons into a nitride film will be briefly explained below with reference to a sectional view of FIG. 9 which shows an example of the structure of a NOR flash memory cell.

Data write is performed by generating channel hot electrons. More specifically, about 9 V, about 5 V, and 0 V, for example, are applied to a control gate 24, to a drain 25, and to a source 26 and a substrate 27, respectively, thereby trapping hot electrons generated in a channel 28 near the drain 25 into a nitride film 29.

Data erase is performed by hot hole injection. More specifically, about −6 V, about 6 V, and 0 V, for example, are applied to the control gate 24, to the drain 25, and to the substrate 27, respectively, and the source 26 is floated. In this manner, holes generated by an inter-band tunnel current flowing from the drain 25 to the substrate 27 are injected into the nitride 29, thereby neutralizing electrons 30 trapped in this nitride film 29.

Data in a NOR flash memory cell which holds data by storing electrons into a nitride film is conventionally rewritten as described above.

When data rewrite is repeatedly performed by the above-mentioned method, however, as shown in FIG. 9, electrons 32 are trapped in an oxide film 31 formed below the nitride film 29. This may deteriorate the transistor characteristics, particularly, the subthreshold characteristic (repetitive data rewrite described above will be referred to as cycling hereinafter).

Generally, when holes are injected into an oxide film the trap level of the oxide film increases. Accordingly, when data is erased by hot hole injection described above, a large number of electrons 32 are trapped in the oxide film 31 formed below the nitride film 29. These trapped electrons 32 deteriorate the subthreshold characteristic.

When the subthreshold characteristic thus deteriorates, the relationship ($V_g$–$I_d$ curve) between a gate voltage $V_g$ and a drain current $I_d$ changes as shown in FIG. 10 before and after cycling. As depicted in FIG. 10, compared to a $V_g$–$I_d$ curve 34 before cycling, a $V_g$–$I_d$ curve 33 after cycling indicates that a drain current $I_d$ at a high gate voltage $V_g$ reduces. Consequently, the memory cell passes program verify even if the electron injection amount in the nitride film 29 is small.

That is, in this conventional semiconductor memory having the NOR flash memory cell which holds data by storing electrons into a nitride film, it is erroneously determined that predetermined electrons are stored in the nitride film 29, although the electrons 30 trapped in this nitride film 29 are few, because the electrons 32 are trapped in the oxide film 31. Accordingly, no satisfactory data holding characteristic of the memory can be obtained.

Additionally, the electrons 32 trapped in the oxide film 31 are present in an unstable region. Therefore, if exposed to a weak electric field or left to stand these electrons 32 readily escape to the substrate 27. Especially when left to stand at a high temperature, these electrons 32 escape to the substrate 27 more easily (leaving electrons to stand at a high temperature will be referred to as baking hereinafter).

When the electrons 32 trapped in the oxide film 31 escape to the substrate 27 by baking or the like, the $V_g$–$I_d$ curve 33 after cycling shown in FIG. 10 changes to a $V_g$–$I_d$ curve 35 after baking shown in FIG. 10.

That is, a flash memory cell after baking restores its subthreshold characteristic compared to the cell after cycling, but increases a drain current $I_d$ at a high gate voltage $V_g$ compared to the cell before cycling. Since electrons stored in the nitride film 29 are few in this case, the memory cell cannot pass program verify.

This decreases the read margin of, e.g., "data 0" (written state), so readout data changes. This may deteriorate the data holding characteristic of the memory.

SUMMARY OF THE INVENTION

The present invention has been made in consideration of the above problems, and has as its object to improve the data holding characteristic of a flash memory cell which holds data by storing electrons.

To achieve the above object, the present invention includes the following aspects.

The first aspect of the present invention is characterized by comprising a cell array including a plurality of memory cells each comprising an electron trapping layer formed above an semiconductor substrate, a control gate formed above said electron trapping layer, and a pair of a source and a drain formed in a surface region of the semiconductor substrate to sandwich a region below the control gate, and a control circuit for performing control including a data erase operation for setting the control gate of a memory cell of the cell array at a negative voltage with respect to the semiconductor substrate, and a detrap operation for making the absolute value of a negative voltage with respect to the semiconductor substrate, which is applied to the control gate, larger than that of the negative voltage during the data erase operation, and at the same time setting the source and drain at 0 V or at a predetermined positive voltage or floating the source and drain.

The second aspect of the present invention is characterized by comprising a cell array including a plurality of memory cells each comprising an electron trapping layer formed above an semiconductor substrate, a control gate formed above said electron trapping layer, and a pair of a source and a drain formed in a surface region of the semiconductor substrate to sandwich a region below the control gate, and a control circuit for performing, during a sequence for writing data in a memory cell of the cell array, control including a detrap operation for setting the control gate at a negative voltage with respect to the semiconductor substrate, and at the same time setting the source and drain at 0 V or a predetermined positive voltage or floating the source and drain.

In the arrangements of the above first and second aspects, electrons stored in the electron trapping layer are extracted appropriately.

In the above first and second aspects, said electron trapping layer preferably comprises a first gate insulating film formed on a semiconductor substrate, an electron trapping film formed on said first gate insulating film and made of an insulator, and a second gate insulating film formed on said electron trapping film.

In this arrangement, electrons not stored in the electron trapping film but trapped in the first gate insulating film below this electron trapping film are extracted.

The control circuit preferably performs the detrap operation during a write sequence for writing data in the memory cell, and more preferably performs the detrap operation immediately after writing data in the memory cell. In this case, electrons trapped in the first gate insulating film after data write can be extracted. As a consequence, electrons are reliably stored in the electron trapping film without being trapped into the first gate insulating film.

The third aspect of the present invention is characterized by comprising a cell array including a plurality of memory cells each comprising an electron trapping layer formed above an semiconductor substrate, a control gate formed above said electron trapping layer, and a pair of a source and a drain formed in a surface region of the semiconductor substrate to sandwich a region below the control gate, and a control circuit for performing, when an operation performed in an erase sequence for erasing data in a memory cell of the cell array is different from a data erase operation, control including a detrap operation for setting the control gate at a negative voltage with respect to the semiconductor substrate, and at the same time setting the source and drain at 0 V or at a predetermined positive voltage or floating the source and drain.

In this arrangement, electrons trapped in the electron trapping layer are extracted appropriately during an erase sequence which is more time-consuming than a write sequence. This shortens the delay time produced during data rewrite.

In the above third aspects, said electron trapping layer preferably comprises a first gate insulating film formed on a semiconductor substrate, an electron trapping film formed on said first gate insulating film and made of an insulator, and a second gate insulating film formed on said electron trapping film.

In this arrangement, electrons trapped in the first gate insulating film are extracted during an erase sequence which is more time-consuming than a write sequence.

In the above third aspect, the control circuit preferably performs the detrap operation immediately after erasing data in the memory cell.

In this configuration, data can be erased after electrons trapped in the first gate insulating film below the electron trapping film are extracted. This shortens the time produced in a data erase sequence.

In each of the above first to third aspects, in the detrap operation the control circuit preferably applies to the control gate a negative voltage within a range capable of preventing an FN current from flowing between the electron trapping film and the semiconductor substrate.

In this configuration, only electrons trapped in the first gate insulating film below the electron trapping film are extracted.

DETAILED DESCRIPTION OF THE PREFERRED EMBODIMENTS (First Embodiment)

A semiconductor memory and method of driving the same according to the first embodiment of the present invention will be described below with reference to the accompanying drawings. This embodiment will be explained by taking a NOR memory cell as an example of the memory cell of the semiconductor memory.

Figure 1:
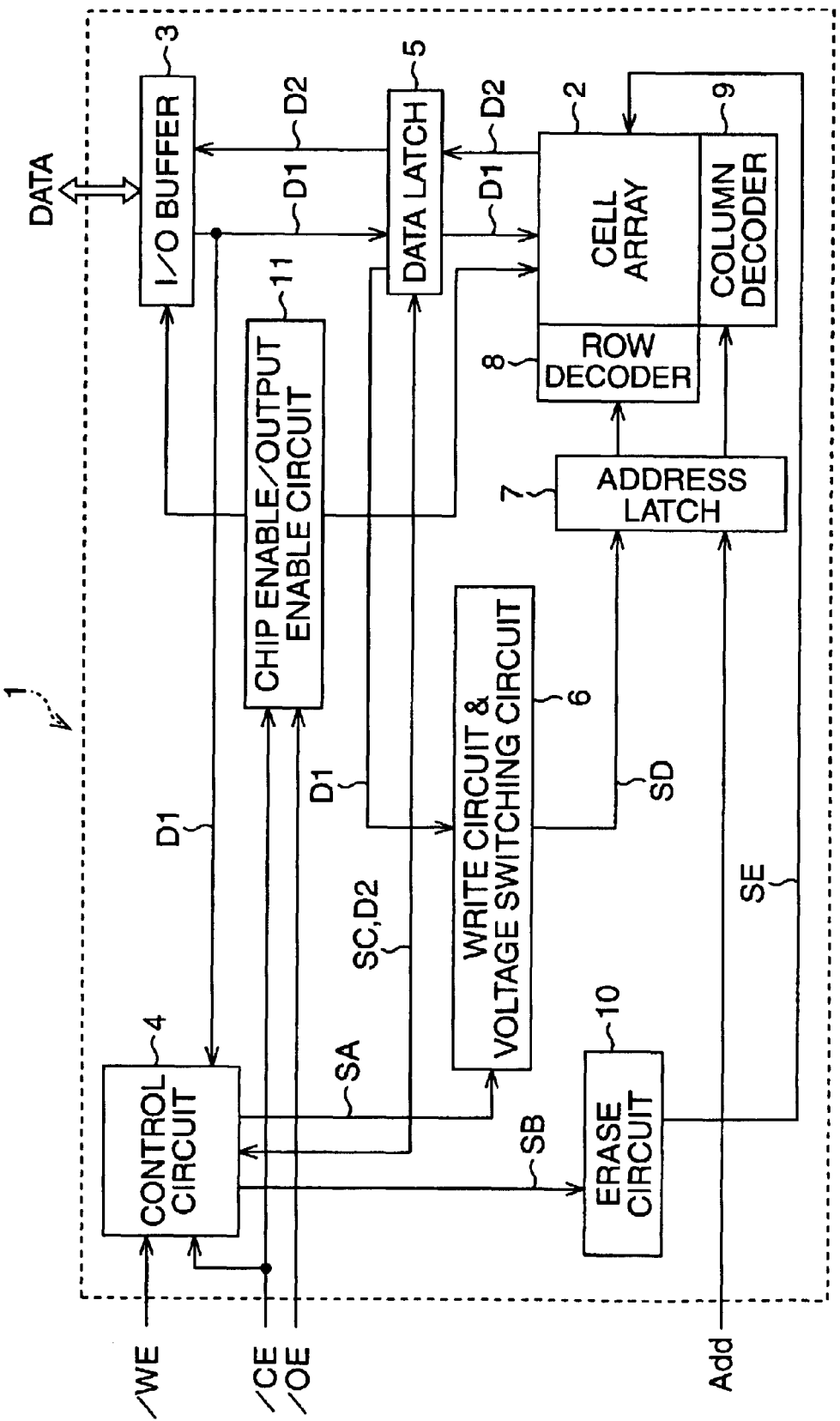
FIG. 1 is a block diagram showing an example of the arrangement of a semiconductor memory according to the first embodiment of the present invention.

FIG. 1 is a block diagram showing an example of the arrangement of the semiconductor memory according to this embodiment.

Referring to FIG. 1, a semiconductor memory 1 includes a cell array 2, an I/O buffer 3, a control circuit 4, a data latch 5, a write circuit & voltage switching circuit 6, an address latch 7, a first decoder 8, a second decoder 9, an erase circuit 10, and a chip enable/output enable circuit 11.

The cell array 2 has a plurality of memory cells which primarily store data supplied from an external device (not shown).

As described above, this embodiment uses a NOR structure memory cell array in which a plurality of memory cells are connected in parallel to one bit line which exchanges data with the outside. This cell array 2 operates on the basis of an inverted signal /CE of a chip enable signal CE input from the chip enable/output enable circuit 11.

The I/O buffer 3 receives from the external device data D1 to be stored in the cell array 2 via the data latch 5, and outputs data D2 stored in the cell array 2 to the external device. This I/O buffer 3 outputs the data D2 to the external device on the basis of an inverted signal /OE of an output enable signal OE input from the chip enable/output enable circuit 11.

The control circuit 4 generates control signals on the basis of an inverted signal /WE of a write enable signal WE and the inverted chip enable signal /CE, thereby totally controlling the operation of this semiconductor memory 1.

Specific examples of the controls signals generated by this control circuit 4 are a memory cell control signal SA for data write, write verify, or erase verify, a data erase control signal SB for data erase, and a data latch control signal SC for controlling the operation of the data latch 5.

"Write verify" is to check whether data is written in a memory cell for which data write is performed. More specifically, the control circuit 4 checks whether the threshold value of a memory cell into which data is written is higher than a predetermined value.

"Erase verify" is to check whether data is erased from a memory cell for which data erase is performed. More specifically, the control circuit 4 checks whether the threshold value of a memory cell from which data is erased is lower than the predetermined value.

On the basis of the data latch control signal SC output from the control circuit 4, the data latch 5 outputs the input data D1 from the I/O buffer 3 to the cell array 2, and outputs the data D2 stored in the cell array 2 to the I/O buffer 3.

Additionally, this data latch 5 outputs to the control circuit 4 the data D2 of a memory cell for which this write verify or erase verify is performed, on the basis of the data latch control signal SC output from the control circuit 4 when write verify or erase verify is performed.

On the basis of this data D2, the control circuit 4 checks whether the threshold value of the memory cell is higher or lower than the predetermined value, thereby performing the write verify or erase verify.

On the basis of the memory cell control signal SA output from the control circuit 4 and the data D1 from the data latch 5, the write circuit & voltage switching circuit 6 outputs to the address latch 7 a memory cell driving signal SD for activating a memory cell.

This write circuit & voltage switching circuit 6 also switches the values of gate voltages to be applied to each memory cell of the cell array 2.

On the basis of the memory cell driving signal SD output from the write circuit & voltage switching circuit 6, the address latch 7 outputs, to the row decoder 8 and the column decoder 9, an address signal ADD of a memory cell into which data is to be written.

On the basis of this address signal ADD, the row decoder 8 and the column decoder 9 designate a memory cell for which data write or read is to be performed.

On the basis of the data erase control signal SB, the erase circuit 10 generates a data erase pulse signal SE for simultaneously erasing, in units of sectors, data stored in the cell array 2, thereby erasing data stored in memory cells.

Figure 2:
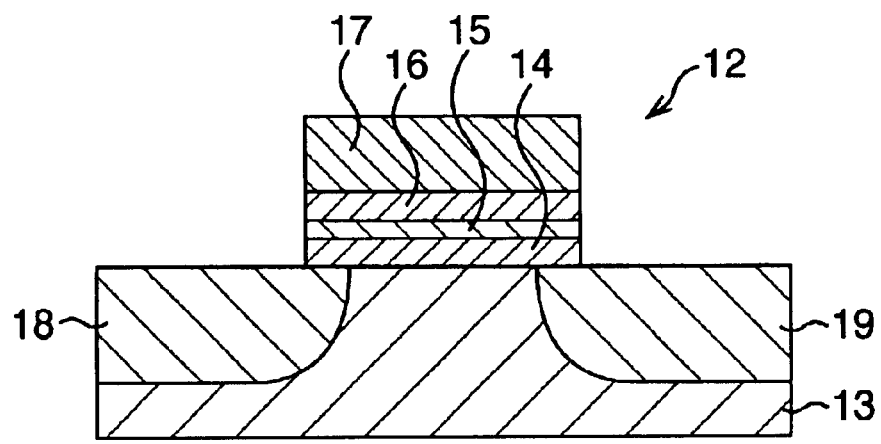
FIG. 2 is a sectional view showing an example of the structure of a NOR flash memory cell formed in a cell array of the semiconductor memory according to the first embodiment of the present invention.
Figure 3:
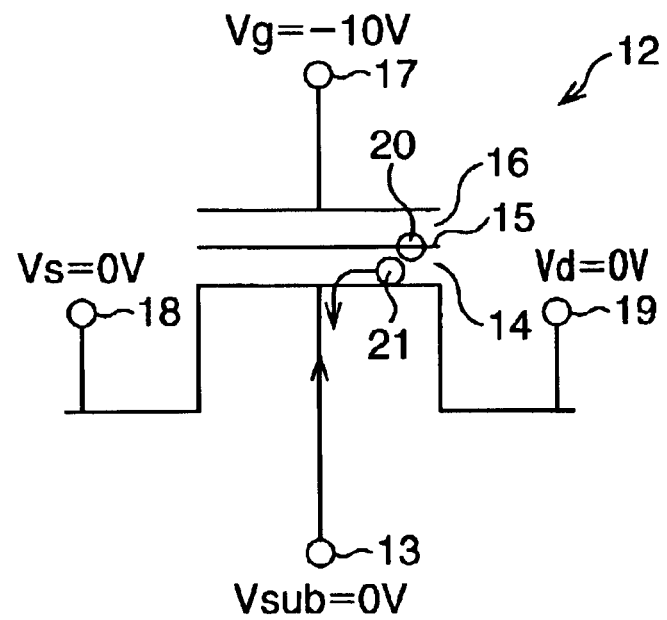
FIG. 3 is an equivalent circuit diagram showing an example of the arrangement of the NOR flash memory cell formed in the cell array of the semiconductor memory according to the first embodiment of the present invention.

FIG. 2 is a sectional view showing an example of the structure of a NOR flash memory cell formed in the cell array 2. FIG. 3 is an equivalent circuit diagram of this NOR flash memory cell shown in FIG. 2.

Referring to FIGS. 2 and 3, a NOR flash memory cell 12 has a p-type silicon substrate 13 as a semiconductor substrate, a first gate oxide film 14 as a first gate insulating film, a nitride film 15 as an electron trapping film, a second gate oxide film 16 as a second gate insulating film, a control gate 17, a first diffusion layer 18, and a second diffusion layer 19.

In the above arrangement, the first gate oxide film 14, the nitride film 15, and the second gate oxide film 16 correspond to an electron trapping layer.

As shown in FIG. 2, the first gate oxide film 14, the nitride film 15, the second gate oxide film 16, and the control gate 17 are sequentially formed on a predetermined region of the p-type silicon substrate 13. That is, the nitride film 15 is formed between the gate oxide films.

The diffusion layers 18 and 19 are formed, for example, by ion-doping an n-type impurity into predetermined regions of the p-type silicon substrate 13 from above the control gate 17, by using this control gate 17 as a mask. For example, the first diffusion layer 18 is a source, and the second diffusion layer 19 is a drain.

As shown in FIG. 3, this NOR flash memory cell 12 saves data by storing electrons 20 into the nitride film 15, and erases data by neutralizing the electrons 20 stored in the nitride film 15.

In the NOR flash memory cell 12 of this embodiment constructed as above, data in a sector containing bits into which data is to be written is erased to obtain the state of "data 1", and then "data 0" is written. After this data write, write verify for checking whether data is written is performed.

More specifically, "data 0" is written by applying, e.g., about 9 V, about 5 V, and 0 V to the control gate 17, to the drain 19, and to the source 18 and the substrate 13, respectively, thereby trapping hot electrons generated in a channel into the nitride film 15.

To avoid over erase of data in memory cells, data erase is executed by first writing data in all bits in a sector from which data is to be erased (this write operation will be referred to as write before erase hereinafter), and then performing erase verify for checking whether the data in all the bits in the sector is erased.

That is, after write before erase by which data is written in all bits in a sector from which data is to be erased is performed, data in the all bits in the sector from which data is to be erased is read out to perform erase verify. If a memory cell fails this erase verify, i.e., if data is not erased, the data is erased in units of sectors.

More specifically, this data erase is performed by applying, e.g., about −6 V, about 6 V, and 0 V to the control gate 17, to the drain 19, and to the silicon substrate 13, respectively, and floating the source 18, thereby injecting into the nitride film 15 holes generated by an inter-band tunnel current flowing from the drain 19 to the silicon substrate 13, and neutralizing the electrons 20 trapped in the nitride film 15.

Data read is performed by reverse read which switches the drain and source to the opposite state from the state in the data write and data erase period described above.

More specifically, the first diffusion layer 18 is used as a drain, the second diffusion layer 19 is used as a source, and about 5 V, about 1.5 V, and 0 V are applied to the control gate 17, to the drain 18, and to the source 19 and the substrate 13, respectively.

Accordingly, if the electrons 20 are trapped in the nitride film 15, these trapped electrons 20 interfere with the formation of a channel to allow no more electric current to flow. This makes it possible to read out the state of the cell.

When data write and erase are repeated as described above, electrons 21 are trapped in the first gate oxide film 14 formed below the nitride film 15. In the semiconductor memory 1 of this embodiment, therefore, these electrons 21 trapped in the first gate oxide film 14 are detrapped in at least one of a data write sequence or data erase sequence.

More specifically, a negative voltage having an absolute value larger than the gate voltage (e.g., −6 V), which is applied to erase data by extracting the electrons 20 stored in the nitride film 15 of the NOR flash memory cell 12, is applied to the control gate 17. At the same time, 0 V (or a positive voltage) is applied to the p-type silicon substrate 13, the source 18, and the drain 19.

Figure 4:
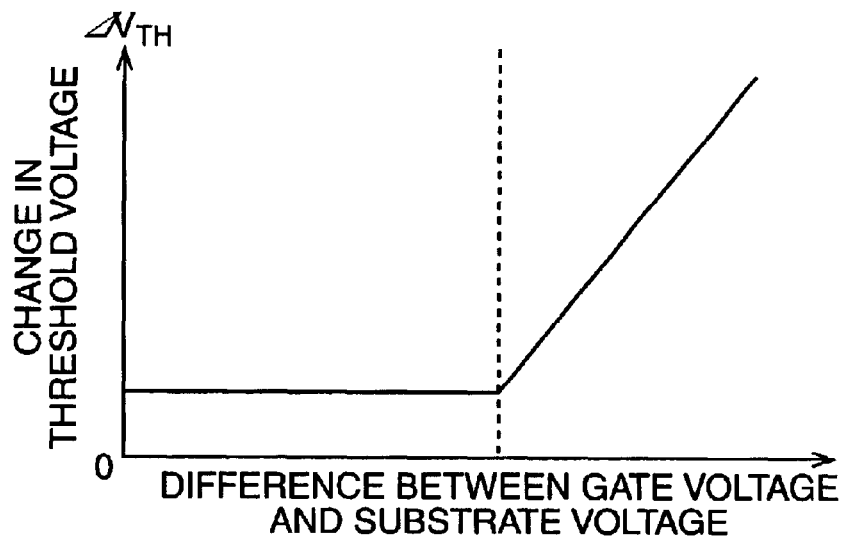
FIG. 4 is a graph showing a change in the threshold voltage as a function of the negative gate voltage according to the first embodiment of the present invention.

If, however, as shown in FIG. 4, an absolute value $V_g$ (the difference between the gate voltage and the substrate voltage) of the voltage applied to the control gate 17 is too high, an FN (Fowler-Nordheim) current flows between the nitride film 15 and the p-type silicon substrate 13. This increases a change $\Delta V_{TH}$ in the threshold value of the flash memory cell 12 before and after detrap. Consequently, those electrons 20 stored in the nitride film 15, which are to be kept stored in it, are also extracted to the p-type silicon substrate 13.

Therefore, the absolute value of the voltage applied to the control gate 17 when the electrons 21 trapped in the first oxide film 14 are detrapped is set within the range which is larger than the gate voltage in data erase and within which the aforementioned FN current does not flow. In this way, only the electrons 21 stored in the first gate oxide film 14 are extracted to the p-type silicon substrate 13.

More specifically, when data is erased by applying, e.g., −6 V to the control gate 17, this control gate 17 is set at −10 V ($V_g = -10$ V), and the silicon substrate 13, the drain 18, and the source 19 are set at 0 V ($V_{sub} = V_d = V_s = 0$ V), thereby detrapping only the electrons 21 stored in the first gate oxide film 14 into the p-type silicon substrate 13.

The data write sequence of the semiconductor memory of this embodiment will be described below with reference to a flow chart in FIG. 5.

First, in step S1, the control circuit 4 performs aforementioned write verify to check whether data is already written in a bit as an object of data write.

More specifically, the control circuit 4 generates and outputs a memory cell control signal SA to the write circuit & voltage switching circuit 6 on the basis of the inverted signal /WE of the write enable signal WE, and generates and outputs a data latch control signal SC to the data latch 5 on the basis of the inverted signal /CE of the chip enable signal CE.

The write circuit & voltage switching circuit 6 receives the memory cell control signal SA and outputs a memory cell driving signal SD to the address latch 7. Consequently, an address signal ADD is output to the decoders 8 and 9 to designate a memory cell for which data write is to be performed. Data D2 of the memory cell designated by the address signal ADD is output to the control circuit 4 via the data latch 5.

On the basis of this data D2, the control circuit 4 verifies that the threshold voltage of the memory cell is higher than the predetermined value described previously, thereby verifying that the electrons 21 stored in the nitride film 15 of this memory cell exceed a predetermined value.

If the memory cell passes this write verify performed by the control circuit 4 as described above, the write operation is completed. If the memory cell fails the write verify and so the control circuit 4 determines that no data is written in the bit as an object of data write, the flow advances to step S2. In step S2, the data latch 5 outputs data D1 to the cell array 2 and writes the data, on the basis of the data latch control signal SC from the control circuit 4.

In step S3, the control circuit 4 applies a negative voltage having a value (e.g., −10 V) within the above-mentioned range to the control gate 17 of the memory cell designated by the operation in step S1, and applies 0 V (or a positive voltage) to the source 18, the drain 19, and the p-type silicon substrate 13, thereby detrapping the electrons 21 trapped in the first gate oxide film 14 into the p-type silicon substrate 13. The flow then returns to the operation in step S1, and the operations in steps S1 to S3 are repeated until the memory cell passes the write verify.

Note that in step S3, the source 18 and the drain 19 can also be floated. Note also that the voltage to be applied to the p-type silicon substrate 13 need not be 0 V, since a negative voltage need only be applied to the control gate 17 with respect to the p-type silicon substrate 13. Furthermore, if positive voltages are to be applied to the p-type silicon substrate 13, the source 18, and the drain 19, positive voltages having substantially the same value are applied to these p-type silicon substrate 13, source 18, and drain 19.

In the embodiment as described above, immediately after data write the electrons 21 trapped in the first oxide film 14 are detrapped into the p-type silicon substrate 13. So, the electrons 21 trapped in the first gate oxide film 14 after data write can be detrapped into the p-type silicon substrate 13 whenever data write is performed. Therefore, input data from an external device can be reliably written in the nitride film 15 of the NOR memory cell 12, and this improves the data holding characteristic.

In this embodiment, detrap is performed immediately after data write in order to well write electrons into the nitride film 15. However, detrap can also be performed not immediately after data write but after the memory cell has passed write verify in the operation in step S1. This can reduce the number of times of detrap. Whether to perform detrap immediately after data write or after the memory cell has passed write verify can be appropriately selected in accordance with the intended use of the semiconductor memory 1.

Figure 5:
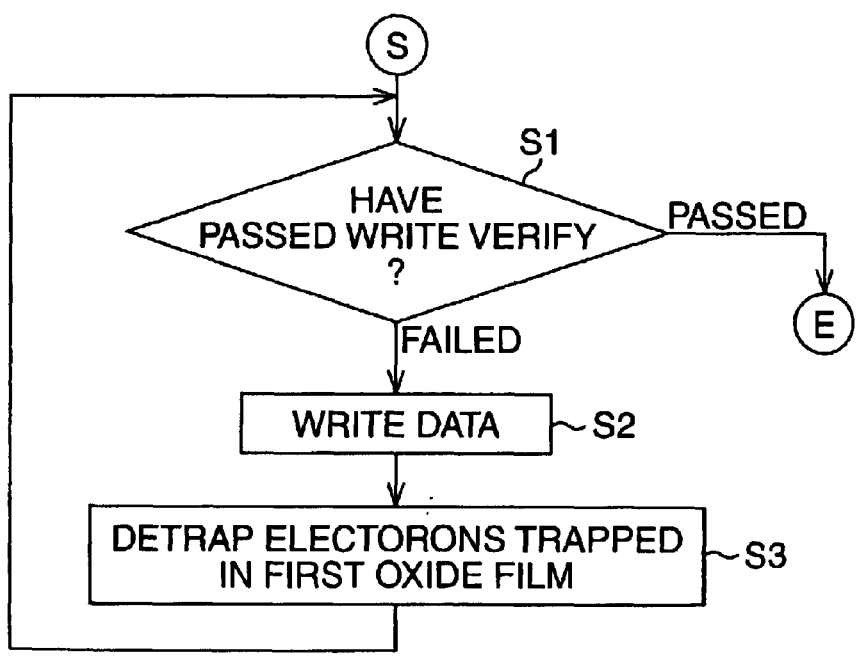
FIG. 5 is a flow chart for explaining a sequence of extracting electrons stored in a first oxide film during data write into a silicon substrate according to the first embodiment of the present invention.

The flow chart shown in FIG. 5 explains a one-bit write operation. To perform a write operation for several bits, after a memory cell of an address has passed write verify in step S1, the operations in steps S1 to S3 are similarly performed for a memory cell of the next address.

The data erase sequence of the semiconductor memory of this embodiment will be described below with reference to a flow chart in FIG. 6.

First, in steps S11 to S15, to avoid over erase of data in a memory cell, the semiconductor memory 1 executes, immediately before data erase, the write before erase sequence described above by which data is written in all bits of a sector as an object of erase.

More specifically, in step S11, the control circuit 4 performs write verify to check whether data is written in bits at addresses in a sector for which data erase is to be performed. This write verify is accomplished by an operation analogous to write verify performed by the operation in step S1 of FIG. 5.

If a memory cell fails this write verify and so the control circuit 4 determines that data is not written in all bits at addresses in the sector, the flow advances to step S12. In step S12, on the basis of the memory cell control signal SA input from the control circuit 4, the write circuit & voltage switching circuit 6 generates a memory cell driving signal SD as a data write signal and outputs this memory cell driving signal SD to all bits at the predetermined addresses via the address latch 7, thereby writing data.

In step S13, the control circuit 4 applies a negative voltage having a value (e.g., −10 V) within the above-mentioned range to the control gate 17, and applies 0 V (or a positive voltage) to the source 18, the drain 19, and the p-type silicon substrate 13, thereby detrapping the electrons 21 trapped in the first gate oxide film 14 into the p-type silicon substrate 13. The control circuit 4 repeats the operations in steps S11 to S13 until the memory cell passes the write verify in step S11.

Note that in step S13, the source 18 and the drain 19 can also be floated. Note also that the voltage to be applied to the p-type silicon substrate 13 need not be 0 V, since a negative voltage need only be applied to the control gate 17 with respect to the p-type silicon substrate 13. Furthermore, if positive voltages are to be applied to the p-type silicon substrate 13, the source 18, and the drain 19, positive voltages having substantially the same value are applied to these p-type silicon substrate 13, source 18, and drain 19.

On the other hand, if in step S11 a memory cell passes the write verify and so the control circuit 4 determines that data is written in all bits at the predetermined addresses from which data is to be erased, the flow advances to step S14. In step S14, the control circuit 4 checks, on the basis of the data D2 output from the data latch 5, whether the write verify in step S11 is performed for the last address in the sector.

If the control circuit 4 determines that the write verify is not performed for the last address in the sector, the flow advances to step S15 to proceed to the next address. That is, write verify in step S11 is reexecuted, and the operations in steps S11 to S15 are repeated until data is written in all bits in the sector.

As described above, the write before erase sequence in steps S11 to S15 writes data in a plurality of addresses, whereas the write sequence in steps S1 to S3 shown in FIG. 5 writes data in one bit. Accordingly, data write and write before erase are executed by the same sequence.

If in step S14 the control circuit 4 determines that the write verify is performed for the last address in the sector, i.e., if data is written in all bits in the sector, the flow advances to step S16, and the control circuit 4 performs erase verify to check whether data in all bits in the sector is erased.

This erase verify is the same as the operation in step S1 of FIG. 5 except that the control circuit 4 verifies, on the basis of the data D2 input from the cell array 2 via the data latch 5, that the electrons 20 stored in the nitride film 15 of a memory cell from which data is to be erased are fewer than a predetermined value. More specifically, the operation of verifying that the electrons 20 stored in the nitride film 15 are fewer than a predetermined value is done by verifying that the threshold voltage of the memory cell is lower than a predetermined value.

If the memory cell passes this erase verify and so the control circuit 4 determines that data in all bits in the sector is erased, the erase operation is completed.

If the memory cell fails this erase verify and so the control circuit 4 determines that data in all bits in the sector is not erased, the flow advances to step S17. In step S17, the erase circuit 10 outputs a data erase pulse signal SE to the cell array 2 to erase data in all bits in the sector, on the basis of the data erase control signal SB output from the control circuit 4.

In step S18, the control circuit 4 applies a negative voltage having a value (e.g., −10 V) within the above-mentioned range to the control gate 17, and applies 0 V (or a positive voltage) to the source 18, the drain 19, and the p-type silicon substrate 13, thereby detrapping the electrons 21 trapped in the first gate oxide film 14 into the p-type silicon substrate 13. The control circuit 4 repeats the operations in steps S16 to S18 until the memory cell passes the write verify in step S16.

Note that in step S18, the source 18 and the drain 19 can also be floated. Note also that the voltage to be applied to the p-type silicon substrate 13 need not be 0 V, since a negative voltage need only be applied to the control gate 17 with respect to the p-type silicon substrate 13. Furthermore, if positive voltages are to be applied to the p-type silicon substrate 13, the source 18, and the drain 19, positive voltages having substantially the same value are applied to these p-type silicon substrate 13, source 18, and drain 19.

Generally, the erase time of the flash memory cell 12 is longer than its write time. More specifically, while the write time is approximately 16 $\mu$sec/word, the erase time is approximately 1 sec/sector.

Accordingly, when detrap is performed during the erase sequence as described above, the influence of a delay of the whole sequence can be made smaller than that when detrap is performed during the write sequence.

Also, when detrap is performed during the erase sequence, electrons trapped in the first oxide film 14 can be removed whenever data is rewritten. This allows the memory cell to pass the write verify in step S11 or the erase verify in step S16 of FIG. 6 within a short time period. Therefore, when data rewrite is to be performed for a memory cell which fails write verify or erase verify, a delay produced by data rewrite can be decreased.

In this embodiment, detrap is performed twice (steps S13 and S18 in FIG. 6) during an erase operation to complete the erase operation within a short time. However, detrap need not be performed twice, i.e., need only be performed in at least one of steps S13 and S18.

Figure 6:
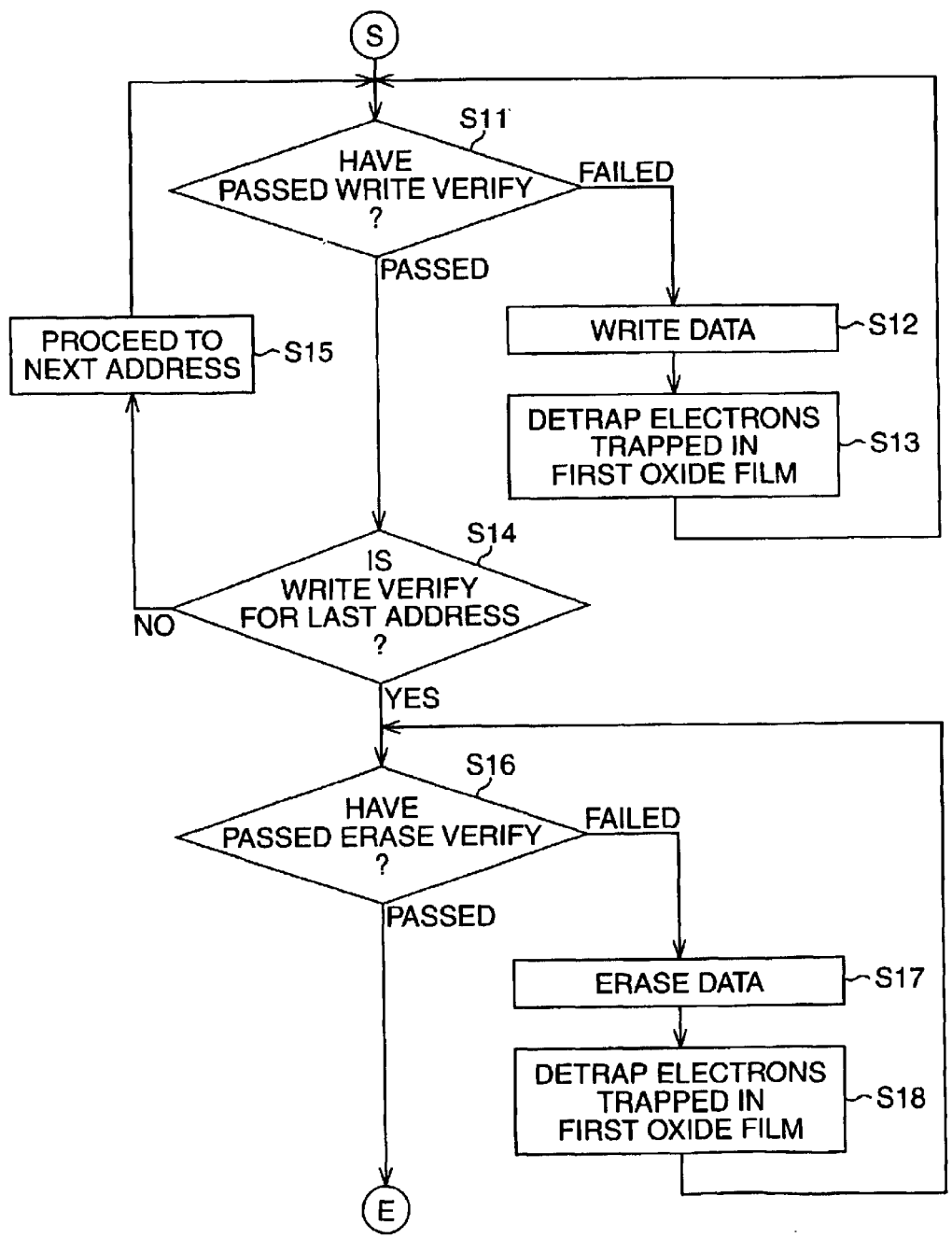
FIG. 6 is a flow chart for explaining a sequence of extracting electrons stored in a first oxide film during data erase into a silicon substrate according to the first embodiment of the present invention.
Figure 7:
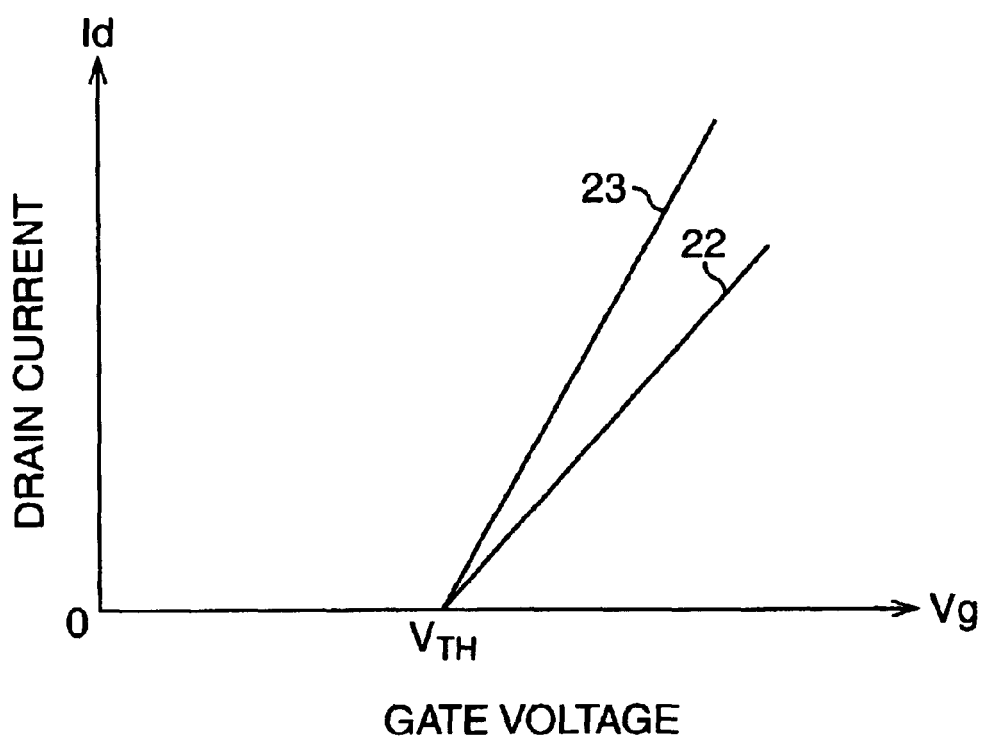
FIG. 7 is a graph showing examples of changes in $V_g$–$I_d$ curves of the flash memory cell before and after detrap according to the first embodiment of the present invention.

FIG. 7 is a graph showing changes in a $V_g$–$I_d$ curve representing the relationship between a gate voltage $V_g$ and a drain current $I_d$ of the NOR flash memory cell 12 before and after detrap performed in step S3 of FIG. 5 and in steps S13 and S18 of FIG. 6.

As shown in FIG. 7, a $V_g$–$I_d$ curve 22 before detrap changes to a $V_g$–$I_d$ curve 23 after detrap.

Accordingly, by detrapping the electrons 21 trapped in the first oxide film 14 by the method described above, the subthreshold characteristic can be improved without changing the threshold value $V_{TH}$ of the memory cell 12.

From the foregoing, the aforementioned write verify and erase verify can be performed on the basis of the threshold value which the NOR flash memory cell 12 originally has. Unlike in the conventional memories, a memory cell in which only few electrons 20 are stored in the nitride film 15 does not pass write verify, and the read margin does not lower to change data. Consequently, the data holding characteristic of the NOR flash memory cell 12 can be improved.

In this embodiment, data is held by storing the electrons 20 into the nitride film 15 such as a silicon nitride film of the NOR flash memory cell 12. However, a film for trapping the electrons 20 to hold data is not restricted to the nitride film 15 as long as the film is an insulator.

Also, detrap is performed by setting the source 18 and the drain 19 at 0 V. However, this voltage need not be 0 V (or a positive voltage) provided that neither hot electron injection nor hot hole injection occurs during detrap. For example, the source 18 and the drain 19 can also be floated.

When hot electron or hot hole injection is thus prevented, the electrons 21 trapped in the first gate oxide film 14 can be reliably detrapped.

(Second Embodiment)

A semiconductor memory and method of driving the same according to the second embodiment of the present invention will be described below. This embodiment is the same as the aforementioned first embodiment except for a sequence of detrapping electrons 21 trapped in a first gate oxide film 14 into a p-type silicon substrate 13 during a data erase operation. Hence, the same reference numerals as in the first embodiment denote the same parts, and a detailed description thereof will be omitted.

Figure 8:
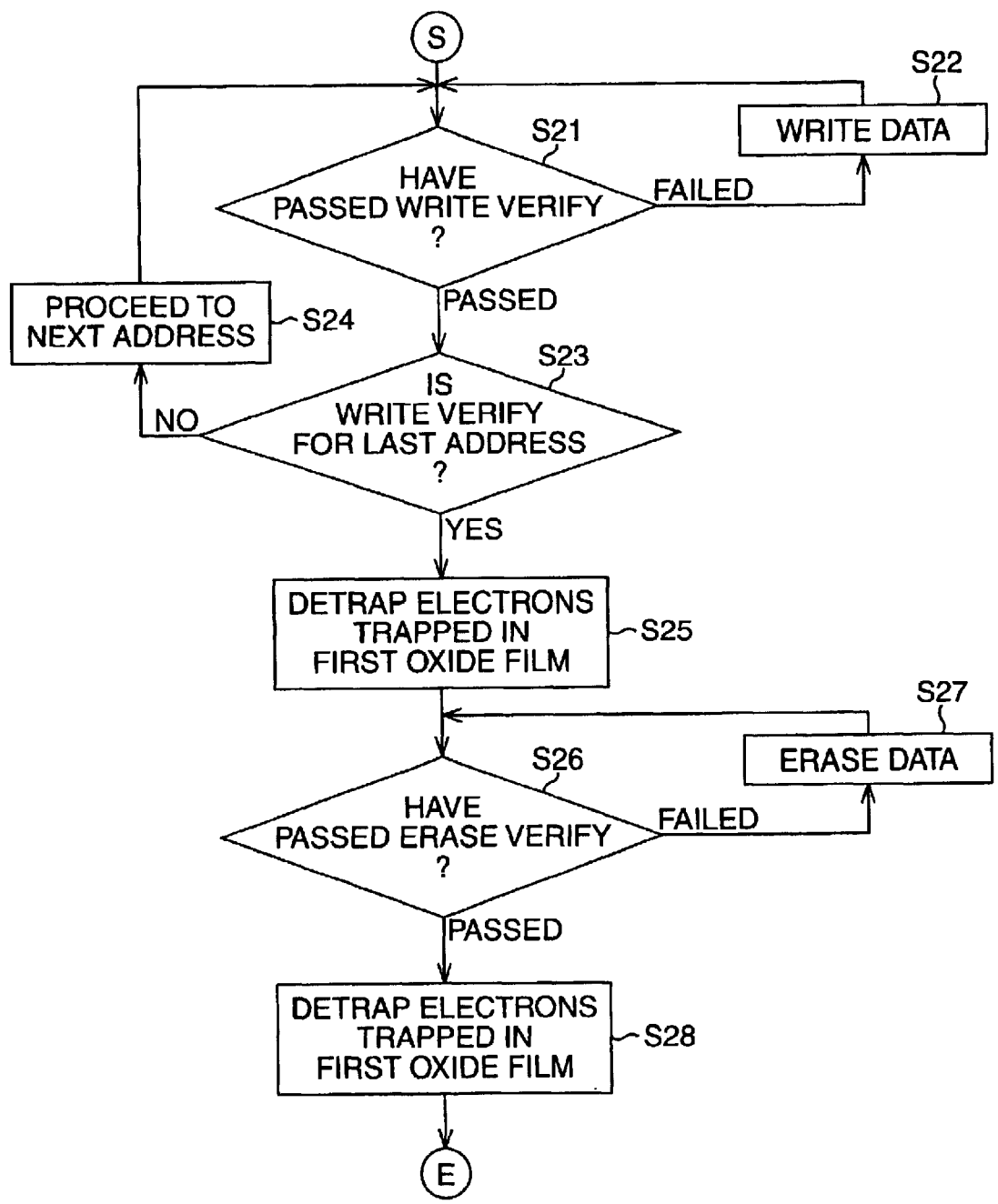
FIG. 8 is a flow chart for explaining a sequence of extracting electrons stored in a first oxide film during data erase into a silicon substrate according to the second embodiment of the present invention.
Figure 9:
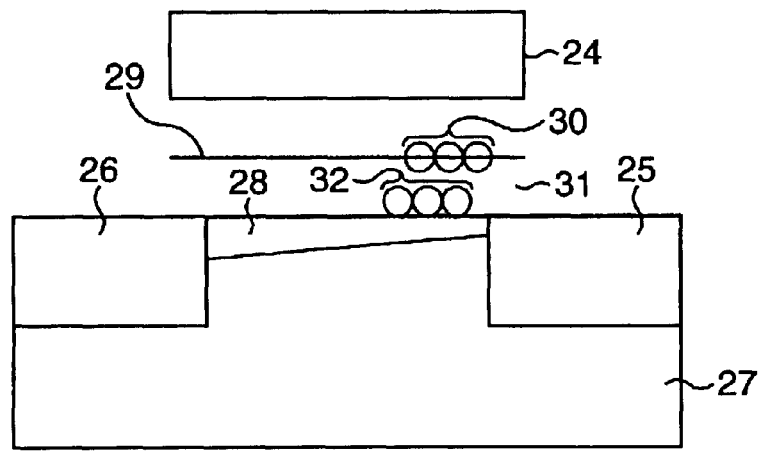
FIG. 9 is a sectional view showing an example of the structure of a NOR flash memory cell according to prior art, in which electrons are trapped into an oxide film formed below a nitride film.
Figure 10:
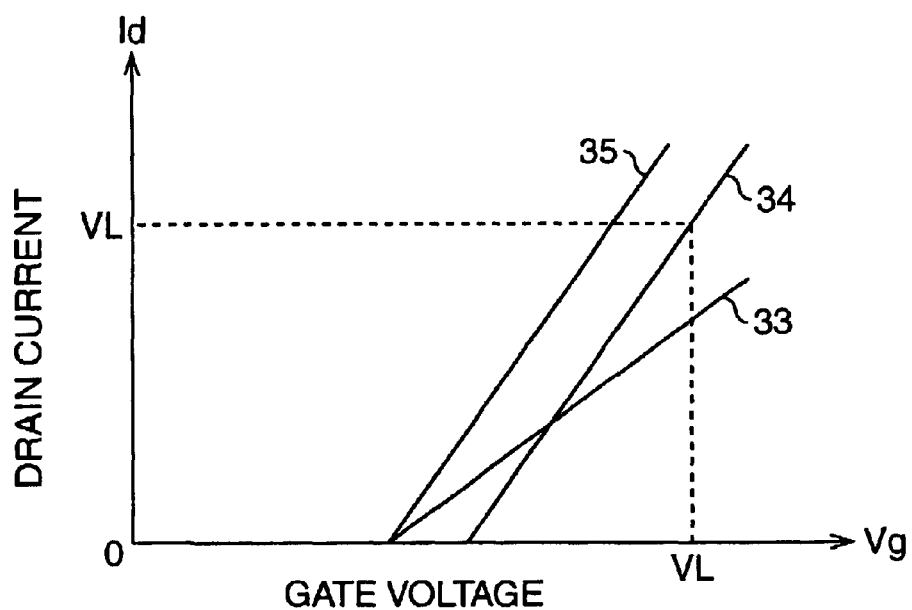
FIG. 10 is a graph showing examples of changes in $V_g$–$I_d$ curves of the flash memory cell before and after cycling according to the prior art.

The data erase sequence of the semiconductor memory of this embodiment will be explained with reference to a flow chart in FIG. 8.

First, in steps S21 to S24, a write-before-erase sequence is executed in the same manner as in steps S11, S12, S14, and S15 of FIG. 6 explained in the first embodiment described above.

That is, if determining in step S21 by write verify that data is not written in all bits at addresses in a sector from which data is to be erased, a control circuit 4 generates a memory cell control signal SA.

In step S22, on the basis of this memory cell control signal SA from the control circuit 4, a write circuit & voltage switching circuit 6 generates a memory cell driving signal SD and writes data in all bits at addresses in the sector via an address latch 7.

On the other hand, if the control circuit 4 determines by write verify that data is written in all bits from which data is to be erased, the flow advances to step S23, and the control circuit 4 checks whether this write verify is performed for the last address in the sector.

If the write verify is not performed for the last address, the flow advances to step S24 to proceed to the next address, and the operations in steps S21 to S24 are repeated until data is written in all bits in the sector.

In step S25, the control circuit 4 applies a negative voltage (e.g., −10 V) within the same range as in the first embodiment to a control gate 17, and applies 0 V (or a positive voltage) to a source 18, a drain 19, and the p-type silicon substrate 13, thereby detrapping the electrons 21 trapped in the first gate oxide film 14 into the p-type silicon substrate 13.

Note that in step S25, the source 18 and the drain 19 can also be floated. Note also that the voltage to be applied to the p-type silicon substrate 13 need not be 0 V, since a negative voltage need only be applied to the control gate 17 with respect to the p-type silicon substrate 13. Furthermore, if positive voltages are to be applied to the p-type silicon substrate 13, the source 18, and the drain 19, positive voltages having substantially the same value are applied to these p-type silicon substrate 13, source 18, and drain 19.

In step S26, the control circuit 4 performs erase verify to check whether data in all bits in the sector is erased. Similar to the erase verify in the first embodiment, the erase verify in the second embodiment is the same as write verify except that the control circuit 4 verifies that the electrons 21 stored in a nitride film 15 of the memory cell are fewer than a predetermined value. More specifically, the operation of verifying that the electrons 21 stored in the nitride film 15 are fewer than a predetermined value is done by verifying that the threshold voltage of the memory cell is lower than a predetermined value.

If the memory cell fails this erase verify and so the control circuit 4 determines that data in all bits in the sector is not erased, the flow advances to step S27. In step S27, an erase circuit 10 outputs a data erase pulse signal SE to a cell array 2 to erase data in all bits in the sector, on the basis of a data erase control signal SB output from the control circuit 4. The operations in steps S26 and S27 are repeated until data in all bits in the sector is completely erased and the memory cell passes the erase verify in step S26.

If the memory cell passes the erase verify and so the control circuit 4 determines that data in all bits in the sector is erased, the flow advances to step S28. In step S28, the control circuit 4 applies a negative voltage (e.g., −10 V) within the same range as in the first embodiment to the control gate 17, and applies 0 V (or a positive voltage) to the source 18, the drain 19, and the p-type silicon substrate 13, thereby detrapping the electrons 21 trapped in the first gate oxide film 14 into the p-type silicon substrate 13.

Note that in step S28, the source 18 and the drain 19 can also be floated. Note also that the voltage to be applied to the p-type silicon substrate 13 need not be 0 V, since a negative voltage need only be applied to the control gate 17 with respect to the p-type silicon substrate 13. Furthermore, if positive voltages are to be applied to the p-type silicon substrate 13, the source 18, and the drain 19, positive voltages having substantially the same value are applied to these p-type silicon substrate 13, source 18, and drain 19.

As described above, detrap is performed for a plurality of cells as objects of data erase at the same time after the write before erase operation, and is performed for a plurality of cells after each individual memory cell has passed erase verify. This can greatly reduce the number of times of detrap, in addition to achieving the same effects as in the first embodiment described previously.

In this embodiment, detrap is performed twice (in steps S25 and S32 of FIG. 8) during an erase operation to complete the erase operation within a short time period. However, detrap need not be performed twice but need only be performed once in step S25 or S32.

The first and second embodiments have been explained by taking a NOR memory cell as a memory cell. However, even in a NAND memory cell electrons trapped in a first oxide film formed below a nitride film can be detrapped in the same manner as above.

In the present invention as has been described above, during a sequence for writing data in a memory cell, the control gate is set at a negative voltage with respect to the semiconductor substrate, and at the same time the source and drain are set at 0 V or at a positive voltage or floated. Accordingly, electrons trapped in the electron trapping layer can be removed appropriately.

According to another characteristic feature of the present invention, the electron trapping layer comprises a first gate insulating film formed on a semiconductor substrate, an electron trapping film formed on said first gate insulating film and made of an insulator, and a second gate insulating film formed on said electron trapping film.

Accordingly, electrons trapped in the first gate insulating film below the electron trapping film can be removed. This makes it possible to write data by well injecting electrons into the electron trapping film, and improve the data holding characteristic.

According to still another characteristic feature of the present invention, during a sequence for erasing data in a memory cell, the control gate is set at a negative voltage with respect to the semiconductor substrate, and at the same time the source and drain are set at 0 V or at a positive voltage or floated. This reduces the influence of a delay of the time required for data rewrite.

According to still another characteristic feature of the present invention, the control gate is set at a negative voltage larger than that during a data erase operation, within a range capable of preventing an FN current from flowing between the electron trapping film and the semiconductor substrate, and at the same time the source and drain are set at 0 V or at a positive voltage or floated. Consequently, only electrons trapped in the first gate insulating film below the electron trapping film can be removed.

What is claimed is:

1. A semiconductor memory comprising:
a cell array including a plurality of memory cells each comprising:
an electron trapping layer formed above a semiconductor substrate, a control gate formed above said electron trapping layer;
a pair of a source and a drain formed in a surface region of said semiconductor substrate to sandwich a region below said control gate; and
a control circuit for performing control including:
a data erase operation for setting said control gate of a memory cell of said cell array at a negative voltage with respect to said semiconductor substrate; and
a detrap operation for making the absolute value of a negative voltage with respect to said semiconductor substrate, which is applied to said control gate, larger than that of the negative voltage during the data erase operation, and at the same time setting said source and drain at 0 V or at a positive voltage or floating said source and drain; wherein
the control circuit makes control such that the potential difference between the semiconductor substrate and the control gate upon a detrap operation is smaller than the potential difference between one of the source and drain in a pair and the control gate upon the data erase operation.

2. The memory according to claim 1, wherein said electron trapping layer comprises a first gate insulating film formed on a semiconductor substrate, an electron trapping film formed on said first gate insulating film and made of an insulator, and a second gate insulating film formed on said electron trapping film.

3. The memory according to claim 2, wherein in the detrap operation, said control circuit applies to said control gate a negative voltage within a range capable of preventing an FN current from flowing between said electron trapping layer and said semiconductor substrate.

4. The memory according to claim 2, wherein said electron trapping layer is a nitride film.

5. The memory according to claim 1, wherein in the detrap operation, said control circuit applies a negative voltage to said control gate and a positive voltage of the same magnitude to said semiconductor substrate, source, and drain, and
an electric field between said control gate and said semiconductor substrate, source, and drain applies a stress which is larger than that in the data erase operation.

6. The memory according to claim 1, wherein said control circuit performs the detrap operation during a write sequence for writing data in said memory cell.

7. A semiconductor memory comprising:
a cell array including a plurality of memory cells each comprising:
an electron trapping layer formed above a semiconductor substrate,
a control gate formed above said electron trapping layer;
a pair of a source and a drain formed in a surface region of said semiconductor substrate to sandwich a region below said control gate; and
a control circuit for performing, during a sequence for writing data in a memory cell of said cell array, control including a detrap operation for setting said control gate at a negative voltage with respect to said semiconductor substrate, and at the same time setting said source and drain at 0 V or at a positive voltage or floating said source and drain; wherein
the control circuit makes control such that the potential difference between the semiconductor substrate and the control gate upon the detrap operation is smaller than the potential difference between one of the source and drain in a pair and the control gate upon the data erase operation.

8. The memory according to claim 7, wherein said electron trapping layer comprises a first gate insulating film formed on a semiconductor substrate, an electron trapping film formed on said first gate insulating film and made of an insulator, and a second gate insulating film formed on said electron trapping film.

9. The memory according to claim 8, wherein in the detrap operation, said control circuit applies to said control gate a negative voltage within a range capable of preventing an FN current from flowing between said electron trapping layer and said semiconductor substrate.

10. The memory according to claim 8, wherein said electron trapping layer is a nitride film.

11. The memory according to claim 7, wherein in the detrap operation, said control circuit applies a negative voltage to said control gate and a positive voltage of the same magnitude to said semiconductor substrate, source, and drain and an electric field between said control gate and said semiconductor substrate, source, and drain applies a stress which is larger than that in the data erase operation.

12. The memory according to claim 7, wherein said control circuit performs the detrap operation immediately after writing data in said memory cell.

13. The memory according to claim 7, wherein said control circuit performs the detrap operation at the end of a write sequence for writing data in said memory cell.

14. The memory according to claim 7, wherein said control circuit performs the detrap operation when an operation performed in an erase sequence for erasing data in said memory cell is different from a data erase operation.

15. A semiconductor memory comprising:
a cell array including a plurality of memory cells each comprising:
an electron trapping layer formed above a semiconductor substrate,
a control gate formed above said electron trapping layer; and
a pair of a source and a drain formed in a surface region of said semiconductor substrate to sandwich a region below said control gate;
a control circuit for performing, when an operation performed in an erase sequence for erasing data in a memory cell of said cell array is different from the data erase operation, control including the detrap operation for setting said control gate at a negative voltage with respect to said semiconductor substrate, and at the same time setting said source and drain at 0 V or at a positive voltage or floating said source and drain; wherein
a control circuit makes control such that the potential difference between the semiconductor substrate and the control gate upon a detrap operation is smaller than the potential difference between one of the source and drain in a pair and the control gate upon a data erase operation.

16. The memory according to claim 15, wherein said electron trapping layer comprises a first gate insulating film formed on a semiconductor substrate, an electron trapping film formed on said first gate insulating film and made of an insulator, and a second gate insulating film formed on said electron trapping film.

17. The memory according to claim 16, wherein in the detrap operation, said control circuit applies to said control gate a negative voltage within a range capable of preventing an FN current from flowing between said electron trapping layer and said semiconductor substrate.

18. The memory according to claim 16, wherein said electron trapping layer is a nitride film.

19. The memory according to claim 15, wherein in the detrap operation, said control circuit applies a negative voltage to said control gate and a positive voltage of the same magnitude to said semiconductor substrate, source, and drain, and an electric field between said control gate and said semiconductor substrate, source, and drain applies a stress which is larger than that in the data erase operation.

20. The memory according to claim 15, wherein said control circuit performs the detrap operation immediately after erasing data in said memory cell.

21. The memory according to claim 15, wherein said control circuit performs the detrap operation at the end of an erase sequence for erasing data in said memory cell.

22. A method of driving a semiconductor memory which comprises a cell array including a plurality of memory cells each comprising:

an electron trapping layer formed above a semiconductor substrate, a control gate formed above the electron trapping layer;
a pair of a source and a drain formed in a surface region of the semiconductor substrate to sandwich a region below the control gate, comprising a control process for performing control including:

a data erase operation for setting the control gate of a memory cell of the cell array at a negative voltage with respect to the semiconductor substrate; and a detrap operation for making the absolute value of a negative voltage with respect to the semiconductor substrate, which is applied to the control gate, larger than that of the negative voltage during the data erase operation, and at the same time setting the source and drain at 0 V or at a positive voltage or floating the source and drain; wherein the control process makes control such that the potential difference between the semiconductor substrate and the control gate upon the detrap operation is smaller than the potential difference between one of the source and drain in a pair and the control gate upon the data erase operation.

23. The method according to claim 22, wherein said electron trapping layer comprises a first gate insulating film formed on a semiconductor substrate, an electron trapping film formed on said first gate insulating film and made of an insulator, and a second gate insulating film formed on said electron trapping film.

24. The method according to claim 23, wherein in the detrap operation, the control process applies to the control gate a negative voltage within a range capable of preventing an FN current from flowing between the electron trapping layer and the semiconductor substrate.

25. The method according to claim 22, wherein the control process performs the detrap operation during a write sequence for writing data in the memory cell.

26. A method of driving a semiconductor memory which comprises a cell array including a plurality of memory cells each comprising:

an electron trapping layer formed above a semiconductor substrate, a control gate formed above the election trapping layer;
a pair of a source and a drain formed in a surface region of the semiconductor substrate to sandwich a region below the control gate, comprising a control process for performing, during a sequence for writing data in a memory cell of the cell array, control including a detrap operation for setting the control gate at a negative voltage with respect to the semiconductor substrate, and at the same time setting the source and drain at 0 V or at a positive voltage or floating the source and drain; wherein the control process makes control such that the potential difference between the semiconductor substrate and the control gate upon the detrap operation is smaller than the potential difference between one of the source and drain in a pair and the control gate upon the data erase operation.

27. The method according to claim 26, wherein said electron trapping layer comprises a first gate insulating film formed on a semiconductor substrate, an electron trapping film formed on said first gate insulating film and made of an insulator, and a second gate insulating film formed on said electron trapping film.

28. The method according to claim 27, wherein in the detrap operation, the control process applies to the control gate a negative voltage within a range capable of preventing an FN current from flowing between the electron trapping layer and the semiconductor substrate.

29. The method according to claim 26, wherein the control process performs the detrap operation immediately after writing data in the memory cell.

30. The method according to claim 26, wherein the control process performs the detrap operation at the end of a write sequence for writing data in the memory cell.

31. The memory according to claim 26, wherein the control process performs the detrap operation when an operation performed in an erase sequence for erasing data in the memory cell is different from a data erase operation.

32. A method of driving a semiconductor memory which comprises a cell array including a plurality of memory cells each comprising:

an electron trapping layer formed above a semiconductor substrate, a control gate formed above the electron trapping layer; and a pair of a source and a drain formed in a surface region of the semiconductor substrate to sandwich a region below the control gate;

comprising a control process for performing, when an operation performed in an erase sequence for erasing data in the memory cell of the cell array is different from a data erase operation, control including a detrap operation for setting the control gate at a negative voltage with respect to the semiconductor substrate, and at the same time setting the source and drain at 0 V or at a positive voltage or floating the source and drain; wherein the control process makes control such that the potential difference between the semiconductor substrate and the control gate upon a detrap operation is smaller than the potential difference between one of the source and drain in a pair and the control gate upon a data erase operation.

33. The method according to claim 32, wherein said electron trapping layer comprises a first gate insulating film formed on a semiconductor substrate, an electron trapping film formed on said first gate insulating film and made of an insulator, and a second gate insulating film formed on said electron trapping film.

34. The method according to claim 33, wherein in the detrap operation, the control process applies to the control gate a negative voltage within a range capable of preventing an FN current from flowing between the electron trapping layer and the semiconductor substrate.

35. The method according to claim 32, wherein the control process performs the detrap operation immediately after erasing data in the memory cell.

36. The method according to claim 32, wherein the control process performs the detrap operation at the end of an erase sequence for erasing data in the memory cell.

* * * * *

UNITED STATES PATENT AND TRADEMARK OFFICE
CERTIFICATE OF CORRECTION

PATENT NO. : 6,856,552 B2
DATED : February 15, 2005
INVENTOR(S) : Satoshi Takahashi It is certified that error appears in the above-identified patent and that said Letters Patent is hereby corrected as shown below:

Column 13,
Line 26, delete "a" and substitute therefor -- the --.

Column 14,
Line 60, delete "a" and substitute therefor -- the --.

Signed and Sealed this

Seventh Day of June, 2005

JON W. DUDAS
*Director of the United States Patent and Trademark Office*